US006975508B2

(12) United States Patent
Hoegener et al.

(10) Patent No.: US 6,975,508 B2
(45) Date of Patent: Dec. 13, 2005

(54) MODULAR ELECTRICAL DEVICE COMBINATION

(75) Inventors: Hans-Juergen Hoegener, Niederkassel (DE); Juergen Volberg, Troisdorf (DE); Artur Wiese, Bornheim (DE); Dieter Bauerfeind, Rheinbach (DE); Joerg Schaefer, Rheinbach (DE)

(73) Assignee: Moeller GmbH, Bonn (DE)

(*) Notice: Subject to any disclaimer, the term of this patent is extended or adjusted under 35 U.S.C. 154(b) by 12 days.

(21) Appl. No.: 10/672,058

(22) Filed: Sep. 26, 2003

(65) Prior Publication Data

US 2004/0106331 A1 Jun. 3, 2004

(30) Foreign Application Priority Data

Sep. 27, 2002 (DE) ................................ 102 45 327
Sep. 27, 2002 (DE) ................................ 102 45 328
Feb. 19, 2003 (DE) ................................ 103 06 937

(51) Int. Cl.7 ................................................ H05K 7/00

(52) U.S. Cl. ....................... 361/686; 361/679; 439/551

(58) Field of Search .................... 174/59, 50; 439/535, 439/551; 248/906; 361/383, 686, 809

(56) References Cited

U.S. PATENT DOCUMENTS

| | | | | |
|---|---|---|---|---|
| 3,770,925 A | | 11/1973 | Nelson et al. | 200/168 |
| 5,278,729 A | | 1/1994 | Hoffman | 361/809 |
| 5,784,253 A | * | 7/1998 | Ooka et al. | 361/686 |
| 6,425,556 B1 | | 7/2002 | Kuepper et al. | 248/56 |
| 6,460,772 B1 | * | 10/2002 | Stahl | 235/486 |

FOREIGN PATENT DOCUMENTS

| | | |
|---|---|---|
| DE | 82 32 239.2 | 5/1983 |
| DE | 82322392 | 5/1983 |
| DE | 29510176 | 10/1995 |
| DE | 4446167 | 7/1996 |
| DE | 29622062 | 4/1997 |
| DE | 19709554 | 6/1998 |
| DE | 19825584 | 12/1999 |
| DE | 29813119 | 12/1999 |
| DE | 19833093 | 1/2000 |
| DE | 10111195 | 9/2002 |
| EP | 0 869 334 | 10/1998 |

OTHER PUBLICATIONS

Moeller "Offene Kommunikation mit Standards [ Open Communication with Standards]" Nov. 2000, pp. 1-18 (see paragraph [0003] of specification).

"One System for Command, Control and Signalling", Moeller GmbH, Bonn, W1160-7363 GB-INT.

From Now on, Automation Comes as a System, Moeller GmbH, Bonn, W2700-7521GB.

"Offene Kommunikation mit Standars" [Open Communication with Standards], W27-7481D, Moeller GmbH, Nov. 2000, Bonn (Discussed in specification at paragraph 0003).

* cited by examiner

*Primary Examiner*—Lynn Feild
*Assistant Examiner*—Zachary Pape
(74) *Attorney, Agent, or Firm*—Davidson, Davidson & Kappel, LLC

(57) ABSTRACT

A modular electrical device combination includes an operator control module and a computer module that can be electrically coupled to the operator control module. The operator control module has a fastening portion on its rear side for installation into a mounting panel. Mechanical connecting means are provided in an extension at a free end of the fastening portion.

19 Claims, 6 Drawing Sheets

30

MODULAR ELECTRICAL DEVICE COMBINATION

Priority is claimed to German patent applications DE 102 45 327.6, DE 102 45 328.4 and DE 103 06 937.2, the subject matters of which are hereby incorporated by reference herein.

The present invention relates to a modular electrical device combination between a first module and a second module, in particular, between an operator control module and a computer module. In this context, the computer module is used for processing and coordinating data and the operator control module serves for displaying text, messages and/or graphics in addition to data entry or the selection of commands.

BACKGROUND

Networked solutions for industrial automation are known from the company magazine "Offene Kommunikation mit Standards" [Open Communication with Standards], W27-7481D, Moeller GmbH, November 2000 (Bonn). This printed publication already describes small control systems such as the control relay "easy", which has a compact design and features an operator control unit, a display unit as well as an integrated computer unit. The printed publication also describes compact PLCs and modular PLCs (programmable logic controllers) that contain only the computer unit together with additional input/output units (I/O's) and are "operated" via separate input and visualization units, which are generally networked via bus systems. These input and visualization units are then formed, for example, by external personal computers or operator or touch panels.

These devices are intended for complex control tasks. In this context, it is a disadvantage that these devices either cannot, or only with corresponding effort, be mounted into the control panel of a control cabinet or the like at the site, that is, where the actual control unit is placed. In particular, sealing of the interior of the control cabinet can be accomplished only with considerable effort in the case of a touch panel that is installed in a control panel.

A standard way of mounting control and signaling devices in a control panel is exemplified in German Patent DE 44 46 167 C2. This document makes no reference to a modular combination of the control and signaling device with a further unit.

There are known ways of snap-in mounting of a housing in a bore of a panel (see German Utility Model Patent DE 82 32 239 U1). It is also known to design the operator control unit in such a manner that it is detachable from a control unit. German Patent DE 197 09 554 C1 proposes to design a device housing composed of upper and lower parts in such a manner that the upper and lower parts can be latched together. The upper part can optionally be composed of a control element or a fastening element. According to German Utility Model Patent DE 295 10 176 U1, it is known to secure an operator control module in keyhole-like openings in a mounting surface using pins. This simple mechanical attachment does not provide the electrical connection. The electrical connection must be accomplished separately, depending on the local conditions.

German Patent Application DE 198 25 584 A1 describes the mounting of a control and signaling device in a control panel. The control and signaling device has an opening in its rear fastening portion into which can protrude a further electrical unit. Means for direct coupling of the control and signaling device to the further electrical unit are not described in this document.

SUMMARY OF THE INVENTION

It is therefore an object of the present invention to provide a device combination which can be installed into a mounting panel or the like and whose modules are provided with mechanical and electrical connecting means in a simple manner, allowing the modules to be directly coupled to each other electrically and mechanically.

The present invention provides a modular electrical device combination between a first module and a second module, in particular, between an operator control module (20A, 20B) and a computer module (30). The first module (20A, 20B) is accommodated in a housing (20') and provided with indicating means (20*a*; 20*c*) and/or actuating means (20*b*) and has at least one fastening portion (21) on its rear side to reach through a corresponding mounting opening in a mounting panel (10). At least one fastening portion (21) including fastening elements (24*a*;24*b*) for mounting on mounting panel (10) is provided. Each of the two modules (20A or 20B; 30) is equipped with electrical (26) and mechanical (23,42,43) means for separable connection to each other. The fastening portion (21) containing the connecting means (26;23,42,43) has at its free end an extension (21*a*) at which or in which the connecting means (26;23,42,43) are accommodated.

According to the present invention is that the operator control module has at least one fastening portion on the rear side of its housing for installation into a mounting panel. In particular, the article according to the present invention is intended for installation into a housing, into a device that controls the closing function of a door, or into a control panel of a control room. For direct coupling, the mechanical connecting means of the operator control module are formed by the fastening portion(s), and the electrical connecting means are formed by contact means located within the/each fastening portion. For this purpose, the computer module is provided with suitable mating means.

Advantageously, it can be made possible to directly couple the two modules without tools. Alternatively, however, the modules can also be spaced apart and electrically connected via cable (indirect electrical coupling).

The operator control module includes indicating and actuating means. For example, a display and/or light-emitting means (such as LEDs) can be present as indicating means. A keypad and/or a sensor (for example, a biometric sensor for measuring biometric data such as finger patterns or the like) can be provided as actuating means. A microphone would be used as a sensor for voice recognition. The sensor to be used for an eye pattern would be a camera. The corresponding received data (finger pattern, acoustic input, image of the iris of an eye) would be transmitted to associated electronics and processed.

Each fastening portion advantageously has dimensions which are identical to the dimensions of conventional control or signaling devices. Due to this, tools and/or mounting panels and corresponding existing openings that are already available for the command devices can be used for mounting the operator control module. The required mounting openings in a mounting surface are relatively small, which allows optimum sealing of the interior of the control cabinet. The IEC protection class IP 65 (complete protection against contact, dustproof, splash-proof) can thus be ensured with simple means.

The sealing can be further optimized in that, in addition to a seal in the region of the/each fastening portion or in the region of the corresponding mounting opening of the/each fastening portion, additional sealing is provided between the rear side of the housing and the mounting surface by a peripheral seal or the like that is arranged in the edge region of the housing of the operator control module.

The electrical contact means are arranged within one or each extension; in the computer module, the electrical contact means are formed by second contact means (plug contacts) located in the region of the opening(s) receiving the/each extension. In this manner, a contact point is provided that is additionally protected against moisture and other external influences. Due to the design of the extensions, which serves as a guide, the plug contacts cannot be damaged by bending during plug-in installation.

The fastening elements are designed as an external thread on the fastening portion for a fastening ring. However, it is also possible to use a latching connection according to German Patent Application DE 198 33 093 A1.

The mechanical connecting means are also designed as latching means which lock without tools, but which can only be unlatched by actuating a latching slide. On the operator control module, the latching means are arranged as an L-shaped latching nose, and the latching means of the computer module are arranged in a latching slide which is supported in such a manner that it can move longitudinally. The L-shaped latching nose and the latching means arranged in the latching slide cooperate in an accurately fitting manner.

The latching slide is designed to include at least one ejection slope which, upon actuation, cooperates with the L-shaped latching nose in the ejection direction.

The latching means have cooperating inclined surfaces for actuating the latching slide during the coupling process of the two modules; in particular, the or one of the fastening portion(s) is provided on its narrow side with a latching nose that is aligned in the actuation direction of the latching slide and has an insertion slope.

On the side of the mechanical connecting means, the computer module has mounting rail fastening means for detachable mounting on a mounting rail; an opening for passing through the fastening portions being provided in the mounting rail in the region of the mechanical connecting means.

Moreover, the device combination is expandable with a further electronic module (also referred to as I/O module) that can be mechanically and electrically coupled to the computer module, resulting in an independent control unit having separate inputs and outputs. For this purpose, the computer module has further separate mechanical connecting means and electrical contact means on its side facing away from the operator control module. The I/O module allows the connection of inputs and outputs. This coupling can also be accomplished directly via the fastening means described or, in the case of spaced apart modules, only by electrical coupling cable via cable. By coupling all three modules, it is possible to provide a complete small control system that allows switching functions to be input by the user via the operator control unit of the operator control module and to be displayed and programmed via a menu-driven user interface on the display of the operator control module. In this context, the electronics forming the small control system can preferably switch the current flow between the inputs and the outputs of the I/O module under the control of a program which is stored in the computer module.

BRIEF DESCRIPTION OF THE DRAWINGS

The present invention will be elaborated upon below based on exemplary embodiments with reference to the drawings, in which.

DETAILED DESCRIPTION

Figure 1A:
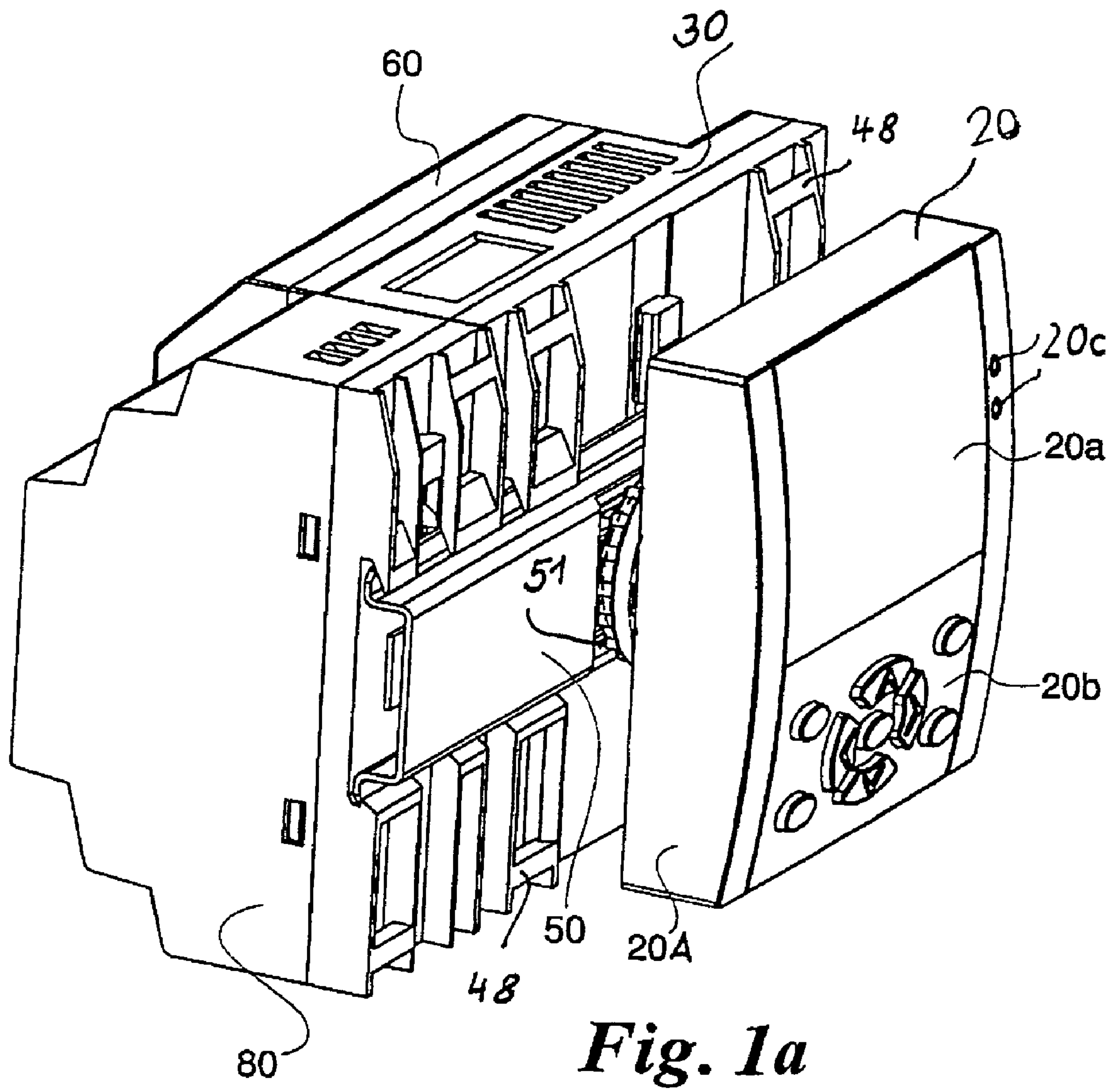
FIG. 1A is a perspective view of an embodiment including an operator control module, a computer module, an I/O module and a coupled expansion module, mounted on a mounting rail.
Figure 1B:
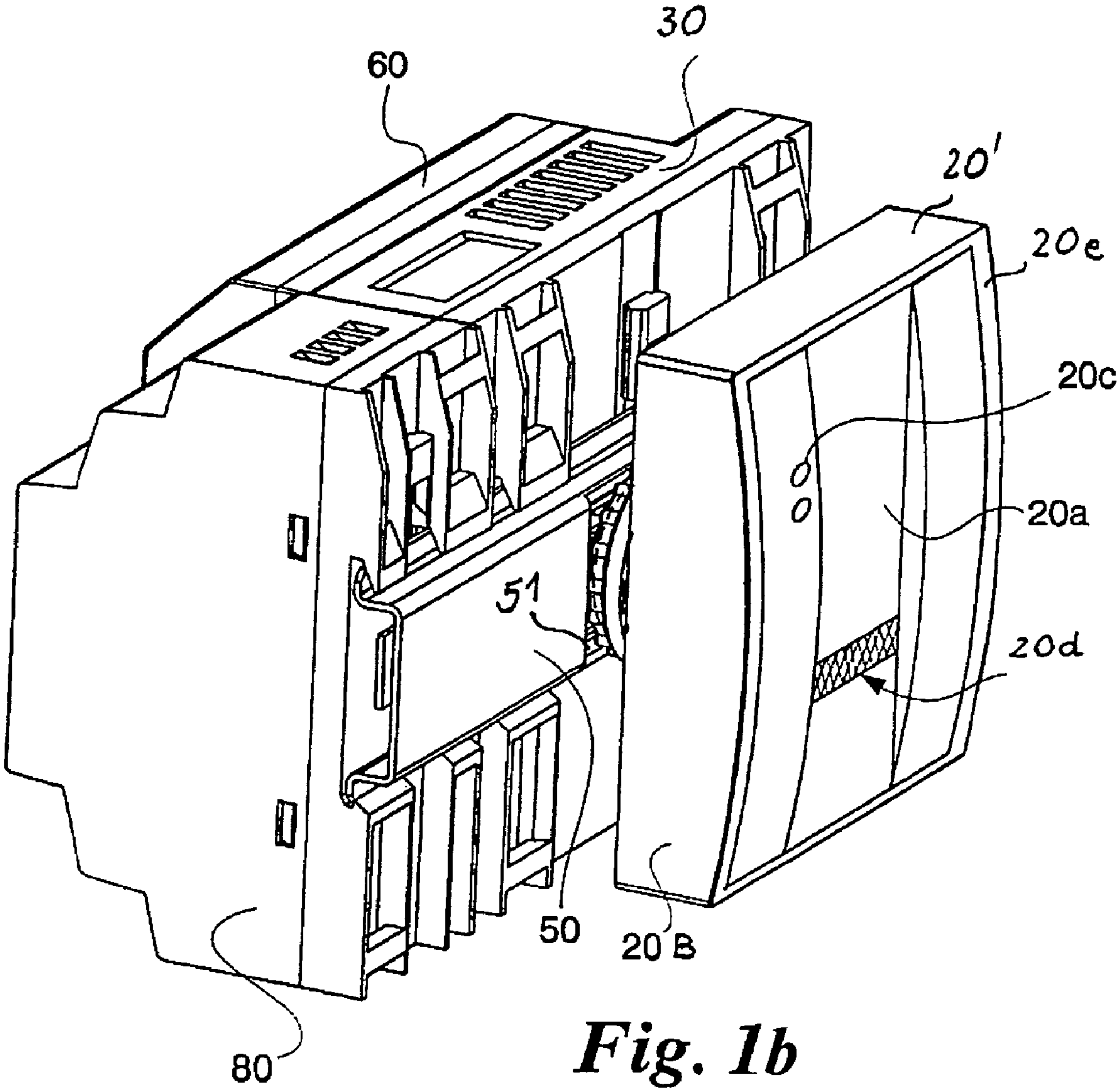
FIG. 1B: is the same as FIG. 1A, but with a finger scanner as the operator control module.

FIGS. 1A and 1B each show a modular device combination including a total of four different modules (20A or 20B, 30, 60, 80), which are directly interconnected mechanically and electrically, forming a unit. In this context, the unit is mounted on a top-hat rail (50) via individual modules.

Figure 2A:
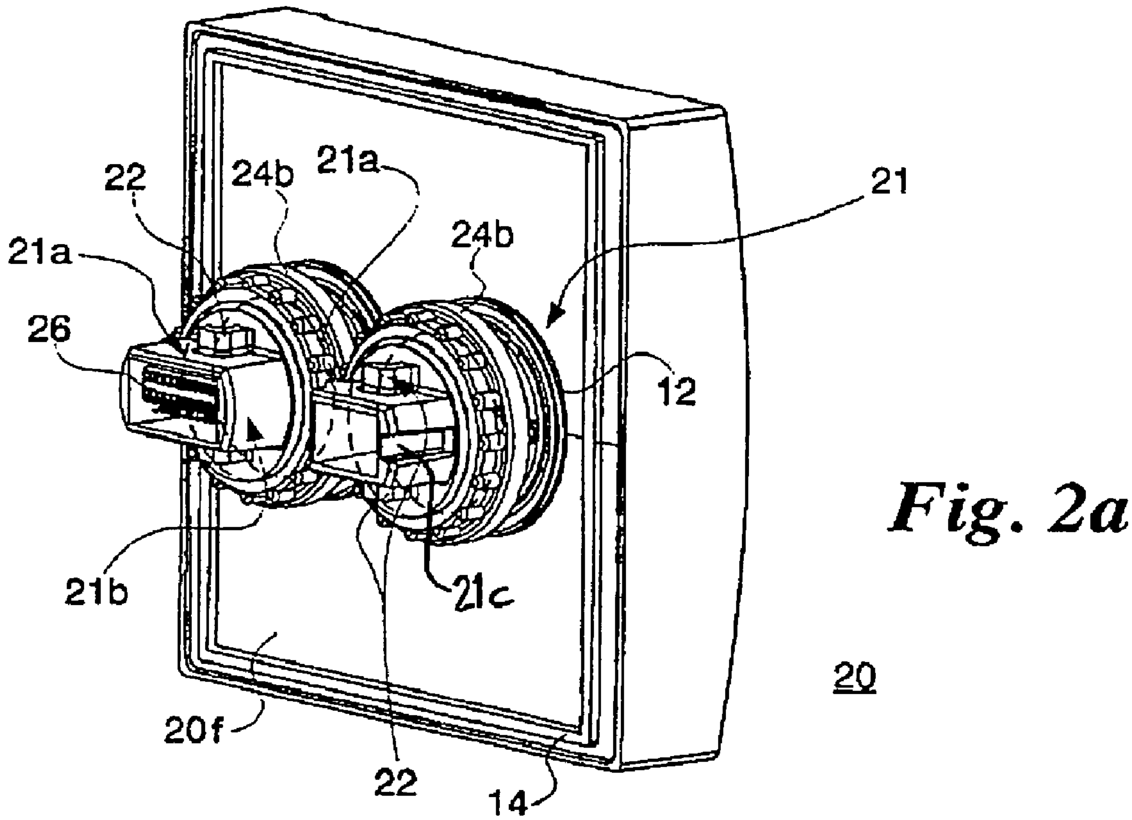
FIG. 2*a* is a perspective view of the rear side of the operator control module.
Figure 2B:
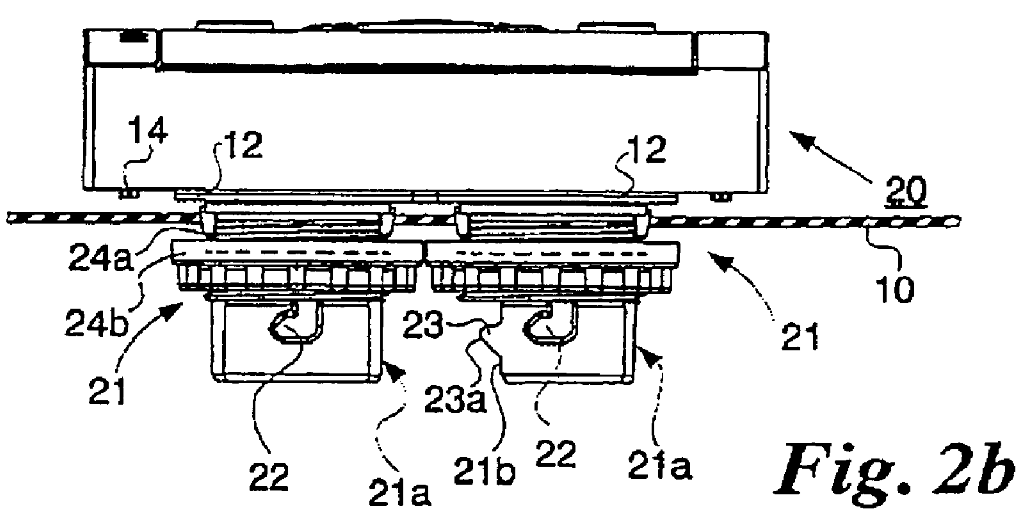
FIG. 2*b* shows the operator control module in a lateral view.

The device combination includes an operator control module (20A, 20B) and a module which is capable of being directly coupled thereto electrically and mechanically and which is hereinafter referred to as "computer module 30". According to the present invention, the operator control module (20A, 20B) has at least one, preferably exactly two fastening portion(s) 21 (FIG. 2*a*, FIG. 2*b*) on its rear side 20*d* for installation or mounting on/into a mounting panel 10. The device combination is intended in particular for installation into a control cabinet door, the control panel of a control room, or into a separate additional housing for rough use in industrial plants. According to the present invention, operator control module 20 includes indicating and actuating means. In FIG. 1A, an integrated graphics display 20*a* is shown as the indicating means. An integrated keypad 20*b* for operator control or for entering data or commands or the like, in particular, a small number of keys (no more than about 10) is/are provided as the actuating means.

The operator control module shown in FIG. 1*b* is a finger scanner 20B. The latter includes a housing (20') which, in particular, has a two-part design and features a pot-like housing cover 20*e*. The front face of the finger scanner shows a plane sliding surface 20*a*' across which a user can slide along a finger. The papillary pattern of his/her fingertip is measured by slit-shaped sensor 20*d* and passed on to computer module 30. Moreover, two light-emitting diodes 20*c* can be seen on the front face, which allow indication of the operating condition of the finger scanner by means of color and/or flashing signals.

Each fastening portion 21 is preferably designed in the form of a standard housing part as is used for command and/or signaling devices. Such fastening portions are generally cylindrical with circular cross-section (16, 18, 20 or 22 mm Ø) and with a corresponding external thread. This has the advantage that the device combination can be inserted into already existing standard openings or mounted using already existing tools for mounting command and signaling devices.

In a preferred embodiment, such a fastening portion 21 is integrally formed with the rear side **20*f* of housing 20' of operator control module (20A, 20B). The rear wall and the fastening portion(s) can be designed in a simple manner as plastic injection molded part. One or more sealing elements can be integrated into the injection molded part using the method of two-component injection molding. Such sealing elements are represented by reference numerals 12 and 14. Sealing element 12 is designed as a sealing ring which is located at the foot of each fastening portion in a groove-like recess in rear wall 20*f* of operator control module housing 20**'. The sealing ring is a highly elastic material (having a low Stookes hardness) which, as mentioned, is already integrated during the manufacture of the rear wall using the two-component injection molding method.

In order to couple one of operator control modules 20A or 20B to computer module 30, the mechanical connecting means **21*a*, 22 are designed in such a manner that the coupling can be accomplished without tools. To this end, each fastening portion 21 has at its free end a contiguous extension 21*a* having a substantially rectangular cross-section. In this context, electrical contact means 26 in the form of a multi-pole plug or the like are arranged within fastening portion 21, preferably only deep inside extension 21*a*. To receive extension 21*a*, a frame-like opening 41 which is adapted to the geometry of extension 21*a* is provided in housing bottom 40' of computer module 30 so that extension 21*a* can be inserted into opening 41 in the bottom of the computer module in an accurately fitting manner. In order to achieve a unique positional correspondence (to prevent insertion with the operator control module rotated out of position), one of extensions 21*a* has a groove 21*c* and the frame of the opening has a nose 41*c***.

Figure 3B:
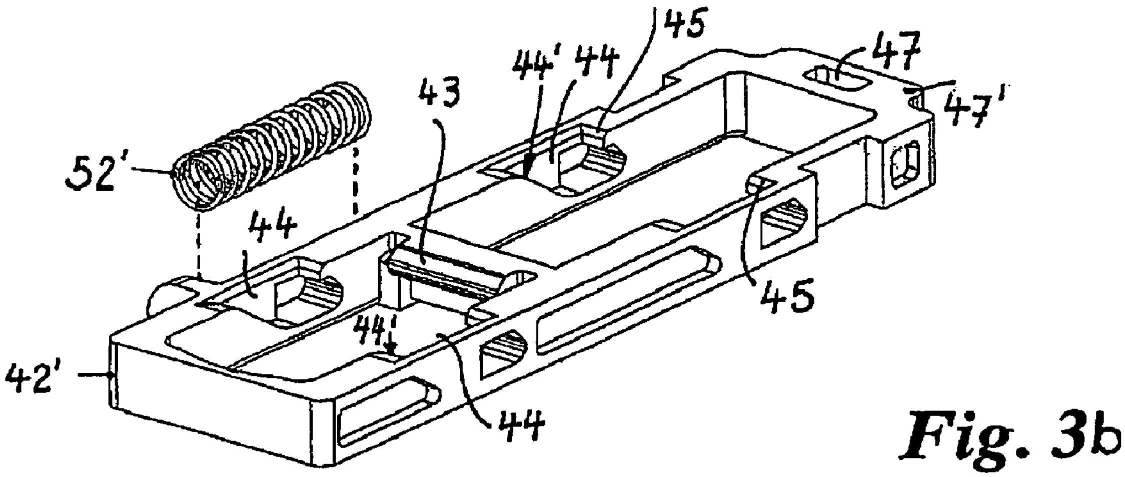
FIG. 3*b* depicts a latching slide with a spring.
Figure 3A:
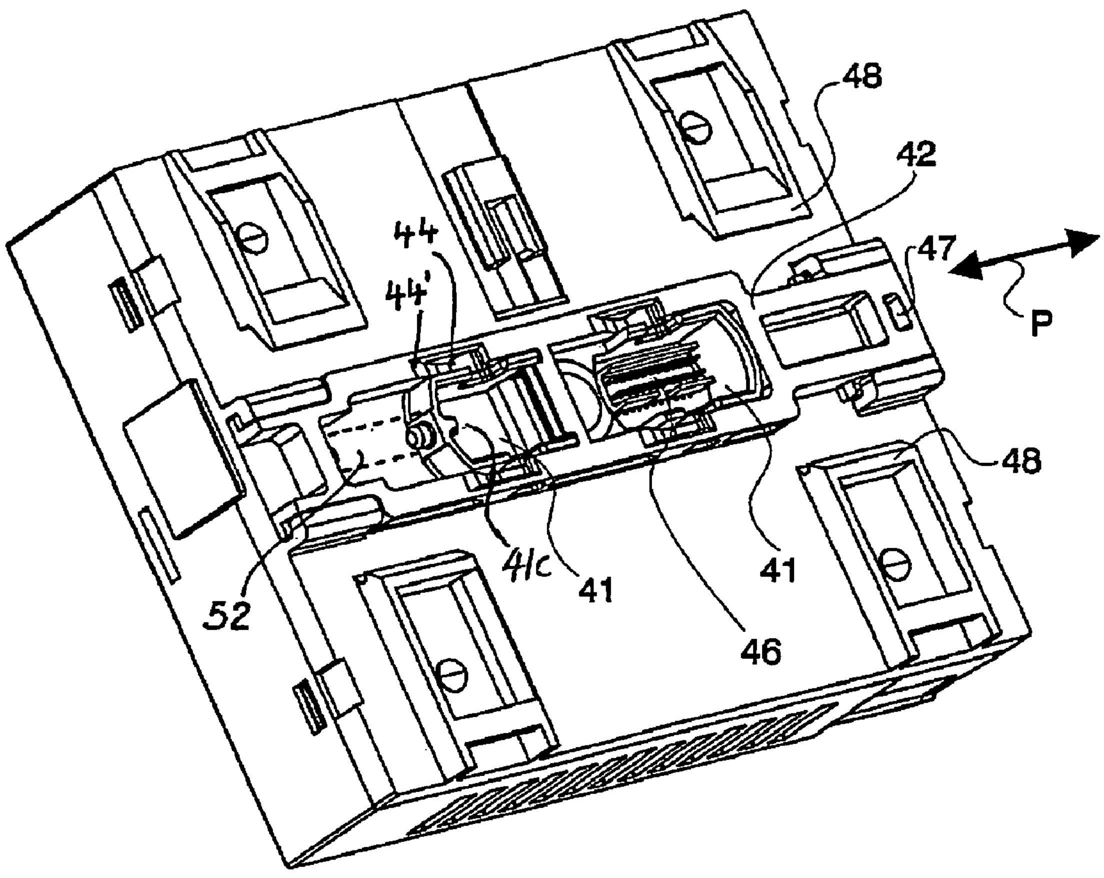
FIG. 3*a* is a perspective view of the computer module.

Since the computer module can be equipped with further modules and because the weight is thereby increased, provision is made for latching elements which are arranged in a latching slide 42. Latching slide 42 is shown in FIGS. **3*a* and 4. FIG. 3*b* is an enlarged view of a latching slide 42' in a geometrically slightly modified form. Latching slide (42, 42') is longitudinally movably supported on housing bottom 40' of computer module 30 in such manner that it can be moved by a spring (52 or 52**'). Preferably, the latching slide is supported in a manner allowing easy removal. This can be useful if the intention is for the computer module to be clipped onto a mounting rail located on the mounting wall. Clipping onto the top-hat rail is difficult, if not impossible, when the latching slide is present. In this case, the computer module cannot be brought into the appropriate angular position for clip-on mounting.

When inserting the operator control module into openings 41, the latching slide is moved from an open position into a latched position. For this purpose, at least one fastening portion 21 is provided on the narrow side of its extension **21*a* with a latching nose 23 that is aligned in actuation direction P of latching slide 42 and has an insertion slope 23*a*. Latching nose 23 and insertion slope 23*a* cooperate with a corresponding bead 43 transverse to direction P in latching slide 42, 42**'.

When the operator control module is in its deepest position in openings 41, the latching slide moves into the latched position. It is is no longer possible to remove one of modules 20A or 20B by simply pulling it out. In this position, latching noses 22 on extension **21*a* cooperate with toes 45 on the latching slide. According to the exemplary embodiment, extension 21*a* is provided with these L-shaped latching noses 22** at least on one of its plane longitudinal surfaces.

To remove an operator control module, it is required to release the latch. To this end, the latching slide must be moved by hand or using a tool. Therefore, latching slide 42 is provided with a gripping edge 47' or a gripping recess 47 for receiving a pin-like tool (for example, for a screwdriver). Upon moving the latching slide, the operator control module is ejected. For this purpose, latching noses 22 and corresponding latching recesses 44 of latching slide 42;42' are provided with guide-out slopes 44'.

In the representation of FIGS. 1A and 1B, a mounting rail 50 having a window 51 can be seen on housing bottom 40' of computer module 30. The mounting rail serves to receive further modules (80). Fastening elements 48 and 49 are used for clamping to the mounting rail. For the coupling of operator control module 20 to computer module 30, top-hat rail 50 is provided with a window 51 to pass through extensions **21*a***. A further window can be provided, if necessary (therefore not shown), to separately pass through additional electrical contact means. Here, there is no need for a separate window because the contact means are arranged in the fastening portion.

Further modules 80 can be mounted at the side of computer module 30 and there coupled thereto electrically and mechanically. Such an expansion module 80 allows, for example, coupling to a specific bus system, such as AS-i, Profibus, or the like, or to an expansion unit having additional input and output terminals.

Figure 4:
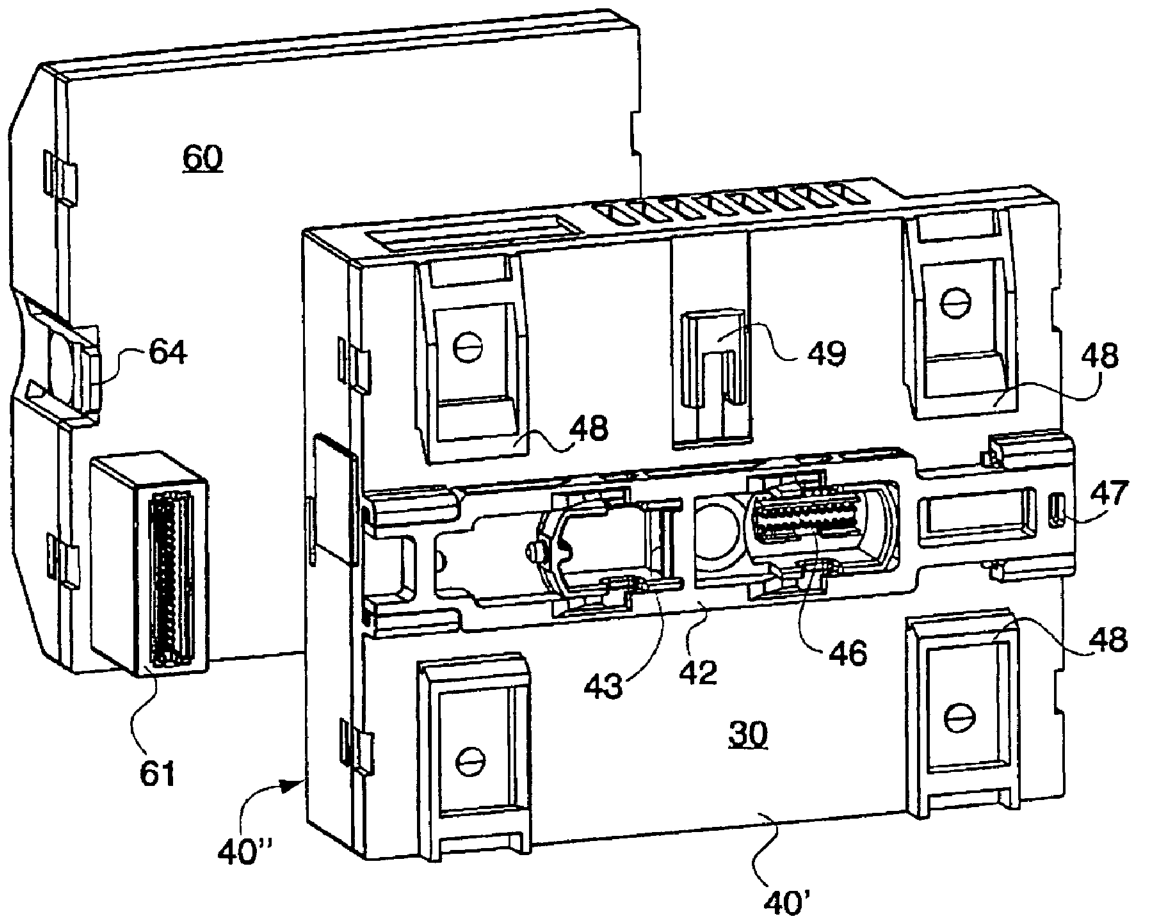
FIG. 4 shows the computer module and the I/O module in an exploded view (rear view)
Figure 5:
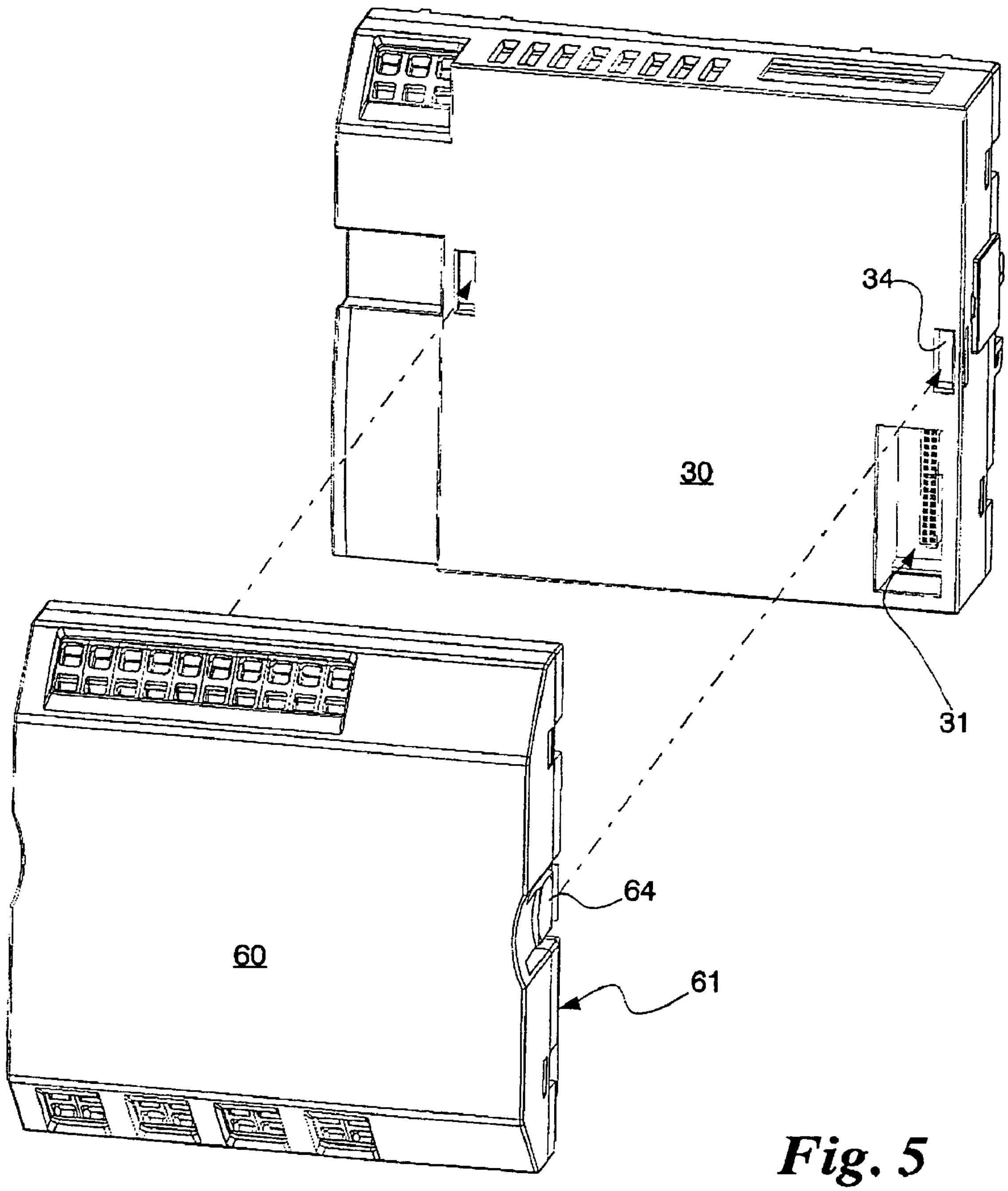
FIG. 5 shows the computer module and the I/O module in an exploded view (front view).

The device combination is expandable with a further electronic module 60 (such as an I/O module) that can be mechanically and electrically coupled. The computer module and I/O module 60 can be seen in FIGS. 4 and 5 in different views. I/O module 60 can be designed as an electronic unit ("control unit") which is arranged in a separate housing and used for conversion and transmission of input and/or output signals, it being also possible, for example, to switch the current flow between the inputs and the outputs in a further electronic module.

For the connection of input and output lines, provision is made for connecting means in the form of screw terminals or spring clamp terminals or the like. The electrical contacting between I/O module 60 and computer module 30 is preferably accomplished via a 36-pole plug connection 31, 61. In this context, plug part 31 of computer module 30 is preferably internally arranged in a housing opening while plug part 61 of I/O module 60 is arranged in a plug extension which is rectangular in cross-section and forms a guide. In this manner, an always secure contact is ensured whose reliability works reliably even after repeated assembly and disassembly. For mechanical connection, I/O module 60 is provided on two opposing side walls with elastic latching hooks 64 for engagement with latching openings 34 of the housing surface of computer module 30. In this manner, secure, direct electrical contacting can be accomplished (i.e., without interconnecting an additional connecting line).

What is claimed is:

1. A modular electrical device combination comprising:

a first module disposed in a housing; and a second module;

wherein the first module includes:

at least one of an indicating device and an actuating device;

at least one fastening portion disposed on a rear side of the first module, the at least one fastening portion being configured to extend through a corresponding mounting opening in a mounting panel, the at least one fastening portion including at least one fastening element configured to mount the first module on the mounting panel, the at least one fastening portion including an extension at a free end thereof;

a first electrical connector device disposed in the extension of the at least one fastening portion and configured to separably connect the first module to the second module; and a first mechanical connector device disposed at the extension of the at least one fastening portion and configured to separably connect the first module to the second module; and wherein the second module includes:

a second electrical connector device configured to separably connect the second module to the first module; and a second mechanical connector device configured to separably connect the second module to the first module.

2. The modular electrical device as recited in claim 1 wherein the first module is an operator control module and the second module is a computer module.

3. The modular electrical device as recited in claim 1 wherein the first module further includes at least one element disposed on a rear side of the housing in a region of the at least one fastening portion and configured to provide a splash-proof seal between the housing and the mounting panel.

4. The modular electrical device as recited in claim 3 wherein the sealing element includes an elastic material integrated in the rear side of the housing by a two-component injection molding process.

5. The modular electrical device as recited in claim 1 wherein the at least one fastening element includes threads for a fastening ring.

6. The modular electrical device as recited in claim 1 further comprising a latching slide and wherein the first mechanical connector device includes a first latch device and the second mechanical connector device includes a second latch device configured to cooperate with the first latch device so as to lock without tools and be unlocked by actuating the latching slide.

7. The modular electrical device as recited in claim 6 wherein the first latch device includes an L-shaped latching nose and wherein the second latch device is disposed in the latching slide, the latching slide being longitudinally movable, the first latch device and the second latch device cooperating in an accurately fitting manner.

8. The modular electrical device as recited in claim 6 wherein the first mechanical connector device includes an L-shaped latching nose and the latching slide includes at least one ejection slope configured to cooperate with the L-shaped latching nose in an ejection direction upon and actuation of the latching slide.

9. The modular electrical device as recited in claim 6 wherein the latching slide includes gripping recess for receiving a pin-like tool so as to operate the latching slide.

10. The modular electrical device as recited in claim 6 wherein the latching slide includes at least one inclined ejection slope which cooperate with the first latch device so as to separate the second module from the first module upon actuation of the latching slide.

11. The modular electrical device as recited in claim 1 wherein the indicating device includes at least one of a display and a light-emitting indicator and wherein the actuating device includes a data input device including at least one of keypad keys and a sensor.

12. The modular electrical device as recited in claim 11 wherein the sensor includes a biometric sensor.

13. The modular electrical device as recited in claim 11 wherein the sensor includes at least one of a sensor for a papillary finger pattern, a sensor for voice recognition, and a sensor for an eye pattern.

14. The modular electrical device as recited in claim 1 wherein the second mechanical connector device includes a mounting rail fastening device disposed on a side thereof configured for detachable mounting of the second module on a mounting rail, the mounting rail including an opening for passing through the at least one fastening portion in a region of the second mechanical connector device.

15. The modular electrical device as recited in claim 1 wherein the second module further includes a third mechanical connector device and a third electrical connector device, the third mechanical connector device and a third electrical connector device being disposed on a side of the second module facing away from the first module, the third mechanical connector device and a third electrical connector device being configured for mechanical and electrical coupling, respectively, of the second module to a further electronic module.

16. The modular electrical device as recited in claim 1 wherein:

the indicating device includes a display;

the actuating device includes a data input device; and the second module is a computer module included in control electronics, control and switching functions being inputtable and programmable by a user using the data input device and the display as a menu-driven user interface

17. The modular electrical device as recited in claim 1 wherein the first and second modules are included in an electronic control unit, the first module being an operator control module and including a biometric scanner, the second module being a computer module configured to store user-related identification data, and being configured, upon a match of data measured by the biometric scanner with the stored user-related identification data, to issue a control command.

18. The modular electrical device as recited in claim 17 wherein the biometric scanner is a finger scanner.

19. The modular electrical device as recited in claim 17 wherein the control command includes at least one of a switching, an enabling and a disabling command.

* * * * *